United States Patent [19]

Hartmann et al.

[11] Patent Number: 4,632,725

[45] Date of Patent: Dec. 30, 1986

[54] METHOD FOR INTERCONNECTING THE ACTIVE ZONES AND/OR THE GATES OF A C/MOS INTEGRATED CIRCUIT

[75] Inventors: Joël Hartmann, Claix; Pierre Jeuch, Seyssins, both of France

[73] Assignee: Commissariat a l'Energie Atomique, France

[21] Appl. No.: 712,218

[22] Filed: Mar. 15, 1985

[30] Foreign Application Priority Data

Mar. 19, 1984 [FR] France ................. 84 04204

[51] Int. Cl.⁴ .............. C23F 1/02; B44C 1/22; C03C 15/00; C03C 25/06
[52] U.S. Cl. .................. 156/643; 29/571; 29/591; 148/187; 156/646; 156/653; 156/656; 156/659.1; 156/662; 357/23.1; 357/41; 357/67; 357/71; 427/88; 427/90
[58] Field of Search .............. 29/571, 591; 148/187; 357/23.1, 41, 67, 65, 71; 427/38, 39, 88-90; 430/313, 317, 318; 156/643, 646, 653, 656, 659.1, 662; 204/192 EC, 192 E

[56] References Cited

U.S. PATENT DOCUMENTS

| | | | |
|---|---|---|---|
| 4,111,725 | 9/1978 | Cho et al. | 156/657 X |
| 4,267,012 | 5/1981 | Pierce et al. | 156/643 |
| 4,432,133 | 2/1984 | Furuya | 29/591 X |
| 4,461,071 | 7/1984 | Poleshuk | 29/571 |
| 4,478,679 | 10/1984 | Chang et al. | 156/656 X |

FOREIGN PATENT DOCUMENTS

84/01052  3/1984  PCT Int'l Appl. .

OTHER PUBLICATIONS

Miller, Nicholas E. et al., "CVD Tungsten Interconnect and Contact Barrier Technology for VLSI", *Solid State Technology*, vol. 25, Dec. 1982, pp. 85-90.

Primary Examiner—William A. Powell
Attorney, Agent, or Firm—Cesari and McKenna

[57] ABSTRACT

A method for interconnecting the active zones and/or the gates of a C/MOS integrated circuit characterized in that, after producing the constituent elements of the integrated circuit with the exception of the connections, on the complete circuit is directly deposited a coating of a conductive material, which is then etched in order to form the desired connection.

16 Claims, 9 Drawing Figures

METHOD FOR INTERCONNECTING THE ACTIVE ZONES AND/OR THE GATES OF A C/MOS INTEGRATED CIRCUIT

BACKGROUND OF THE INVENTION

The present invention relates to a method for interconnecting the active zones and/or the gates of a C/MOS integrated circuit. This method more particularly makes it possible to form short distance connections between the sources and drains of MOS transistors (metal—oxide—semiconductor) with a n or p channel entering in the construction of the C/MOS integrated circuit (complementary MOS), whilst also connecting the sources and/or drains to the gates of said same transistors.

C/MOS integrated circuits, the simplest of which is an inverter formed solely by a n channel transistor and a p channel transistor, one being non-conductive and the other conductive and vice versa, have the advantage of consuming very little electric power. However, they have a low integration density. The latter is more particularly linked with the need for frequently connecting n+ type regions (source or drain of n channel transistors) and p+ regions (source and drain of p channel transistors), this necessity being explained by the fact that each elementary gate of the integrated circuit comprises both n channel transistors and p channel transistors.

As shown in FIG. 1, which in longitudinally sectional form illustrates a C/MOS inverter, these connections are presently obtained after forming the constituent elements of the circuits, i.e. the active zones such as sources 2 and 8 and the drains 4 and 6 of the circuit transistors, the gates 12 and 14 thereof and the field oxide 16, by firstly depositing on the complete integrated circuit an insulating coating 18, which is generally of silicon oxide, followed by the etching of said insulating coating in order to form electric contact holes, such as 20 and 22 of both the active zones and the gates. Finally, onto the etched insulating coating 18 is placed a conductive coating 24, which is generally of aluminium, which is etched in order to form the desired connections, such as connection 24a between the n channel transistor drain 4 and drain 6 of the p channel transistor of the inverter.

In such a method, apart from the surface occupied by the actual connections, it is essentially the electric contact holes 20, 22 formed in the insulating coating and the guards such as 26, 27 necessary for the positioning of said holes, which reduce the integration density of C/MOS integrated circuits.

In order to increase the integration density of such C/MOS circuits, particularly by reducing the surface occupied by the connections, sometimes circuits are produced with two interconnection levels and which are generally of aluminum. However, this complicates the method for producing such circuits to a significant extent and does not make it possible to eliminate the problem of the electric contact holes in the insulating coating.

SUMMARY OF THE INVENTION

The present invention relates to a method for interconnecting the active zones and/or gates of C/MOS integrated circuits making it possible to obviate these disadvantages and in particular significantly increase the integration density of such circuits.

After forming the constituent elements of the integrated circuit, such as the active zones, gates and field oxide, this method makes it possible to produce the desired connections without previously depositing on the complete integrated circuit an insulating coating and forming therein the electric contact holes necessary for producing the connections.

It can be advantageously used for producing short distance connections, i.e. connections between sources and drains and/or gates of the transistors of the integrated circuit.

More specifically, the present invention relates to a method for interconnecting the active zones and/or gates of a C/MOS integrated circuit, wherein, after forming the constituent elements of the integrated circuit, with the exception of the connections, onto the complete circuit is directly deposited a coating of a conductive material, called the first material, after which said conductive material coating is etched in order to provide the desired connections.

The term constituent elements of an integrated circuit is understood to mean everything which forms the circuit, i.e. the field oxide, sources, drains and gates of the transistors, the charge-coupled devices (CCD), etc, prior to the formation of the various circuit connections. The insulating coating in which electric contact holes are formed and used in the prior art to make it possible to produce the circuit connections obviously does not form part of the constituent elements of the integrated circuit.

Due to the fact that in the method according to the invention, there is no deposition of the insulating coating and no electric contact holes are formed therein for producing the different connections of the circuit, it is possible to considerably increase the integration density of the C/MOS circuits.

According to a special embodiment of the method according to the invention, the coating of the first conductive material is etched by a plasma.

According to another special embodiment of the method according to the invention, the following successive stages are performed:

deposition on the complete integrated circuit of the coating of the first conductive material, deposition on the coating of the first conductive material of a coating of a second material, which is different from the first conductive material, formation of a mask on the second material coating representing the image of the connections to be formed, elimination of that part of the second material coating which is free from the mask, elimination of that part of the first conductive material coating which is free from the remainder of the second material coating, and, elimination of the mask.

In order to bring about a self-alignment of the connections on the active zones (source and drain) of the integrated circuits, the method according to the invention can advantageously comprise the following successive stages:

lateral insulation of the integrated circuit gates, deposition of the coating of the first conductive material on the complete integrated circuit, deposition on the first conductive material coating of a first resin coating which cancels out the relief of the first conductive material coating, etching the first resin coating, so as to only leave resin at the locations of the active zones to be interconnected, formation of a mask respresenting the image of the connections to be formed in a second resin coating, elimination of that part of the first conductive material coating which is free from resin, and elimination of the resin.

Advantageously, the first conductive material coating is constituted by an alloy of titanium and tungsten and the coating of the second material is of silicon, silicon oxide or aluminum.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
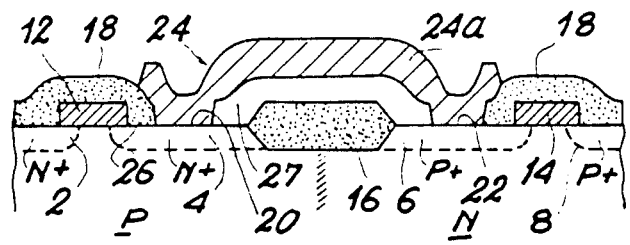
FIG. 1, already described, in longitudinal sectional form a C/MOS inverter, illustrating the prior art interconnection process for such a circuit.
Figure 2:
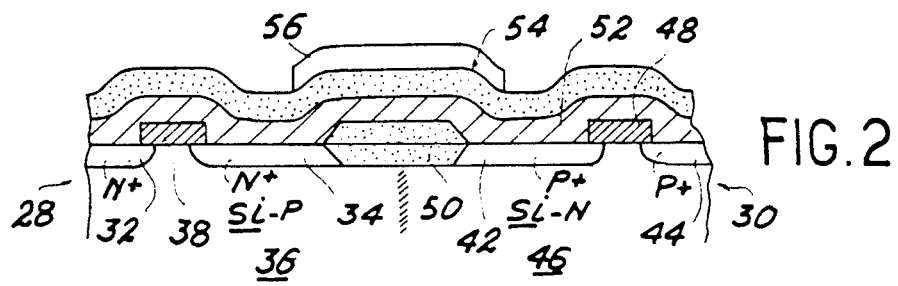
FIGS. 2 to 5 in longitudinal sectional form, the different stages of the method according to the invention in accordance with a first embodiment thereof.

FIGS. 2 to 5 show a C/MOS inverter, constituted by a n channel MOS transistor 28 and a p channel MOS transistor 30, which are to be interconnected.

The n channel transistor 28 has a source 32 and a drain 34, formed in a semiconductor substrate 36, e.g. of p type silicon, as well as a gate 38, e.g. formed from doped polycrystalline silicon. In the same way, the p channel transistor 40 has a source 44 and a drain 42 formed in a semiconductor substrate 46, particularly of n type silicon, as well as a gate 48, e.g. of doped polycrystalline silicon or silicide.

These transistors 28, 30 are separated from one another by a field oxide 50, which is produced e.g. according to the LOCOS technology (local oxidation of substrate). This field oxide 50 is partly embedded in the semiconductor substrate.

The sources, drains and gates of these two transistors 28, 30, as well as the field oxide 50, represent what is called the constituent elements of the integrated circuit, in this case a C/MOS inverter.

According to the invention, the interconnection of drain 34 of the n channel transistor 28 and the drain 42 of the p channel transistor 30 is brought about by the direct deposition on the complete integrated circuit of a conductive material coating 52, called the first material, followed by the etching of said first conductive material coating 52 in order to obtain the desired connection (FIG. 5), particularly the connection of drain 34 and drain 42 of the integrated circuit. Coating 52, which is preferably of a titanium—tungsten alloy, containing e.g. 90% by weight tungsten and 10% by weight titanium, can be deposited by magnetron sputtering and has a thickness of e.g. 0.1 μm.

Conductive coating 52 can be etched in the manner shown in FIGS. 2 to 5, i.e. by firstly depositing on said coating 52 a coating 54 of a second material, which differs from the first material forming coating 52. Coating 54, deposited e.g. by magnetron sputtering, can be of silicon or silicon oxide and optionally aluminum. It can have a thickness of approximately 500 Å ($5.10^{-2}$ μm).

On coating 54 is formed a mask 56, e.g. of resin, using conventional photolithography processes and which represents the image of the connection 52a (FIG. 3) to be formed, i.e. it serve to define the dimensions of said connection.

Figure 3:
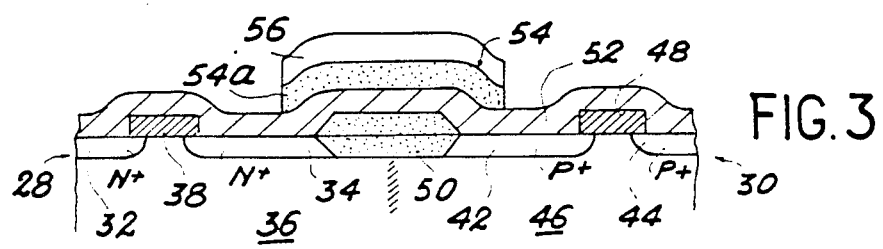

After forming the mask, that part of the coating 54 of the second material which is free of the mask is eliminated. The structure obtained is shown in FIG. 3. When coating 54 is made from silicon oxide, the etching thereof can e.g. be carried out chemically with hydrofluoric acid (HF) as the etching agent and when the coating is of silicon, etching can be carried out by using a plasma containing sulphur hexafluoride ($SF_6$).

Figure 4:
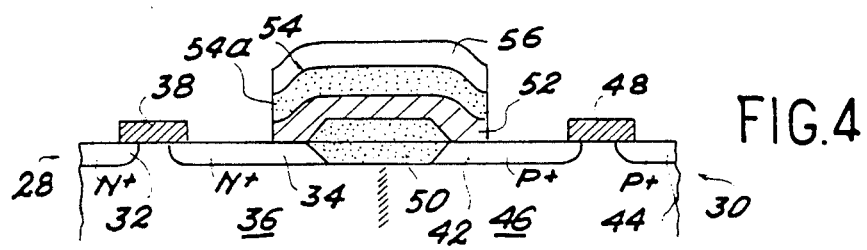

The following stages of the method according to the invention consist of eliminating that part of the first conductive material coating 52 which is not covered with the remainder 54a of coating 54, as shown in FIG. 4. The remainder 54a of coating 54 acts as a mask for the etching of conductive coating 52, which can be carried out by chemical etching, e.g. using a solution containing sulphuric acid ($H_2SO_4$) and hydrogen peroxide ($H_2O_2$), when said coating 52 is made from Ti-W.

Figure 5:
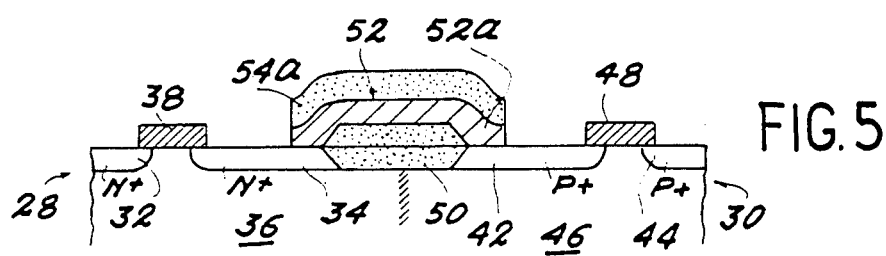

This mixture of sulphuric acid and hydrogen peroxide also makes it possible to eliminate resin mask 56. The final structure is shown in FIG. 5.

The conductive material coating 52 which has been etched in this way makes it possible to interconnect the drain 34 of n channel transistor 28 and the drain 42 of the p channel transistor 30.

Apart from its mask function for the etching of coating 52, the use of a coating 54 of a second material, such as silicon or silicon oxide, makes it possible to prevent during the irradiation of the photosensitive resin for forming the mask, the interference phenomenon in said resin, said phenomenon being due to the high reflecting power of said conductive coatings generally used (in this case Ti-W). Thus, within the resin coating, it is possible to obtain a more accurate image of the connection to be formed.

FIGS. 6 to 9 show another embodiment of the method according to the invention. This embodiment makes it possible to obtain a self-alignment of the interconnection line to be produced, e.g. line 52a, on the active zones to be connected, e.g. drain 34 and drain 42 respectively of the n channel transistor 28 and p channel transistor 30.

Figure 6:
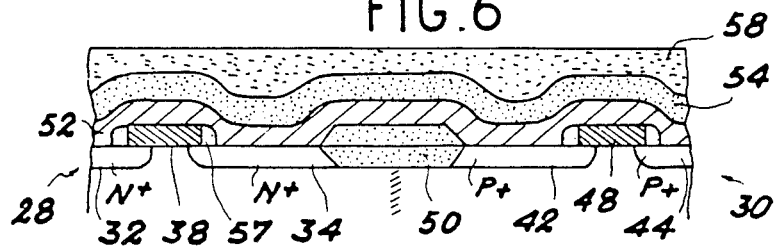
FIGS. 6 to 9 in longitudinal sectional form, the different stages of the method according to the invention in accordance with a second embodiment thereof.

As stated previously, after forming the constituent elements of the integrated circuit, i.e. the sources, drains and gates of transistors 28, 30 and the field oxide 50, as shown in FIG. 6, a lateral insulation 57 of gates 38, 48 of the integrated circuit is produced in the form of insulating strips of approximate widths 2500 Å (0.25 μm). This lateral insulation can be of silicon oxide or silicon nitride. It can be produced in known manner, e.g. with the aid of the process described in U.S. Pat. No. 4,234,362, filed on Nov. 18, 1980 by J. RISEMAN, or with the aid of the process described in French Pat. No. 2,525,029, filed on Apr. 8, 1982 in the name of the present Applicant.

It should be noted that the field oxide 50 is shown, as hereinbefore, partly embedded in the semiconductor substrate (LOCOS). However, in this embodiment of the inventive method, field oxide 50 could be advantageously entirely in relief.

After producing said lateral insulation 57 of the integrated circuit gates, the first conductive material coating 52, which is preferably of Ti-W is deposited with a thickness of approximately 0.1 micron on the complete circuit, e.g. using the magnetron sputtering process. This coating of constant thickness has a profile dependent on the shape of the underlying coatings and particularly cavities at the level of the active zones (drains 34, 32).

This is followed by the optional deposition on said conductive material coating 52 of a coating 54 of a second material and which differs from that constituting conductive coating 52. Coating 54, which is preferably of silicon, silicon oxide or aluminum, also has a profile dependent on the shape of the underlying coatings, in this case conductive coating 52, and in particular has cavities at the locations of the active zones (drains 34, 42).

Possible coating 52 is then covered with a first photosensitive resin coating 58, such as is conventionally used in photolithography. As a function of the viscosity of the resin used, the resin coating 54 is advantageously heat treated, in order to obtain an optimum planar surace, e.g. by heating at between 200° and 250° C.

Figure 7:
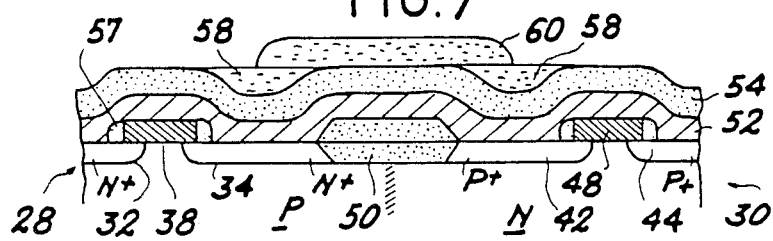

The following stage of the method consists, as shown in FIG. 7, of etching the resin coating 58, so as to only leave behind resin at the locations of the active zones to be interconnected, e.g. drains 34 and 42, i.e. at the locations hollowed out from coating 54, if the latter exists, or at the locations hollowed out from the conductive coating 52, if coating 54 is absent. In an automatic manner, resin 58 is only kept at the locations of the active zones, bearing in mind the profile of coating 54 or 52. Said etching can e.g. be carried out with the aid of a dry etching process using an oxygen plasma.

Following said etching of the resin coating 58, in a second resin coating 60 is formed a mask representing the image of the connection 52a to be formed using conventional photolithography processes.

Figure 8:
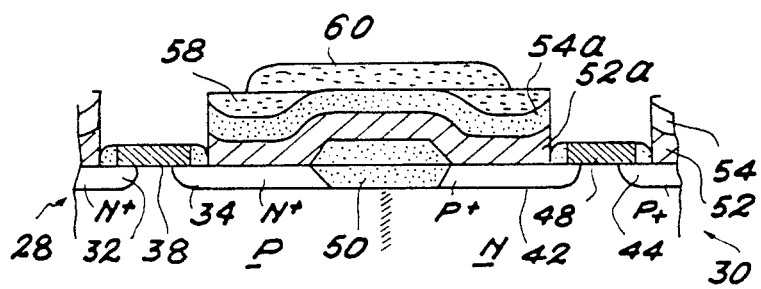

As shown in FIG. 8, the following stage of the method, consists of eliminating that part of the coating 54 of the second material which is free from resin, i.e. which is not covered by mask 60 and the remainder of the resin coating 58 filling the cavities of coating 54, when the latter is used. This elimination can be carried out by chemically etching coating 54, particularly using hydrofluoric acid as the etching agent, when the coating is made from $SiO_2$. When the coating 54 is made from aluminum, said etching can be carried out by using a plasma containing $CCl_4$.

This is followed by the elimination of the unmasked part of the conductive material coating 52, i.e. that part not covered by the remainder 54a of the coating 54 of the second material. In the case of a conductive coating 52 of a titanium—tungsten alloy, etching can be carried out by using a plasma containing $SF_6$.

Figure 9:
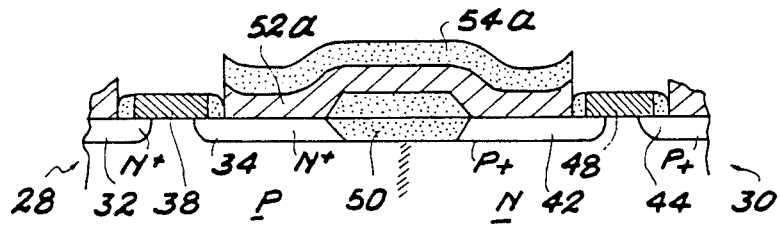

Finally and as shown in FIG. 9, the resin is eliminated, i.e. mask 60 and the remainder of the resin coating 58.

Through thus etching the conductive material coating 52 in order to obtain the connection 52a of active zones 34, 42 using the resin mask 60 and the resin coating 58 etched in the same way as hereinbefore, makes it possible to obtain a connection 52a between the active zones 34, 42 of the integrated circuit, whose ends are in contact with the lateral insulation or insulating strips 57 of gates 38, 48 of the integrated circuit, i.e. there is a self-alignment of connection 52a on said active zones. This self-alignment has the advantage of eliminating the guards which are normally necessary for the alignment of the resin mask 60 on active zones 34, 42.

The use of a coating of the second material of silicon, silicon oxide or aluminum makes it possible to prevent the exposure of the Ti-W coating 52 to an oxidizing atmosphere during the subsequent stages. The use of aluminium for coating 54 also makes it possible to lower the resistance of the thus formed interconnection lines.

As has been stated hereinbefore, the above method described with reference to FIGS. 6 to 9 can also be performed without using the second material coating 54, which serves more particularly to obtain a better image of the connection 52a to be formed in the resin constituting mask 60. In this case, following the formation of resin mask 60, that part of the conductive coating 52 which is free from resin is eliminated i.e. that part not covered by mask 60 and the remainder of the resin coating 58. Said etching of conductive coating 52 can be carried out by using a plasma e.g. containing $SF_6$, when coating 52 is of Ti-W. Following the etching of coating 52, the resin, i.e. mask 60 and the remainder of the resin coating 58 is eliminated.

In the embodiment of the inventive method using lateral insulation 57 of the integrated circuit gates (FIGS. 6 to 9), it is possible to carry out a supplementary stage, immediately after producing said insulation, which consists of implanting ions in the active zones to be connected and specifically in the integrated circuit drains 34, 42. This ion implantation makes it possible to prevent any short-circuit risks between the sources and drains of the integrated circuit and the substrate of said circuit, particularly on the edge of the field oxide. Such a short-circuit could result from a slight etching of the field oxide during the various stages of the method according to the invention and particularly when producing the lateral insulation 57 of the integrated circuit gates. This ion implantation also makes it possible to obtain at the integrated circuit gate 38, 48, a double junction of the sources and drains, which makes it possible to reduce the electric field between the adjacent gates and drains.

Ion implantation can be carried out by on each occasion masking the complementary regions, i.e. the type n+ regions and then the type p+ regions with the aid of a resin mask. It can also be carried out with arsenic ions with an energy of 130 keV and a dose of $5.10^{15}$ at/cm² for type n+ regions and boron ions with an energy of 40 keV and a dose of $3.10^{15}$ at/cm² for type p+ regions.

The method according to the invention makes it possible, in C/MOS integrated circuits, to produce short distance links, i.e. links between the sources and drains of said circuits and/or the gates, without previously depositing and then etching an insulating coating. This makes it possible to considerably increase the integration density of said circuit. The long distance connections of these circuits can be produced in a conventional manner.

The method according to the invention has been described in this case of a connection between the drains of the C/MOS inverter, but it could obviously also be used for other types of connection and in particular for connecting the gates of the integrated circuit transistors to the sources or drains of the same transistors.

What is claimed is:

1. A method for interconnecting the active zones and for interconnecting gates and active zones formed in a substrate of a C/MOS integrated circuit comprising the following successive stages, after forming the constituent elements of said integrated circuit with the exception of the first connection level:

- depositing directly onto the complete circuit a coating of a first conductive material,
- depositing on said coating of said first conductive material a coating of a second material which is different from said first conductive material,
- forming a mask on the second material coating representing the image of the first connection level to be formed,
- eliminating that part of said second material coating which is free from said mask,
- eliminating that part of said first conductive material coating which is free from the remainder of said second material coating, and
- eliminating said mask.

2. A method according to claim 1, wherein said coating of said first conductive material is etched by means of a plasma.

3. A method according to claim 1 wherein said second material coating is of silicon or silicon oxide.

4. A method according to claim 1 wherein said second material coating is of aluminum.

5. A method according to claim 1 wherein said first conductive material coating is formed from a titanium—tungsten alloy.

6. A method according to claim 4 or 5 wherein following the lateral insulation of the gates, ion implantation takes place in the active zones of the integrated circuit.

7. A method for interconnecting the active zones and for interconnecting gates and active zones formed in a substrate of a C/MOS integrated circuit comprising the following successive stages, after forming the constituent elements of said integrated circuit with the exception of the first connection level:

- depositing directly onto the complete circuit a coating of a first conductive material,
- laterally insulating said integrated circuit gates,
- depositing directly a coating of a first conductive material on the complete integrated circuit,
- depositing on said first conductive material coating a first resin coating which cancels out the relief of said first conductive material coating,
- etching said first resin coating so as to only leave behind resin at the locations of said active zones to be interconnected,
- forming a mask representing the image of the first connection level to be formed in a second resin coating,
- eliminating that part of said first conductive material coating which is free from first and second resins, and
- eliminating the resins.

8. A method according to claim 7, wherein said coating of said first conductive material is etched by means of a plasma.

9. A method according to claim 7, wherein said second material coating is of silicon or silicon oxide.

10. A method according to claim 7, wherein said second material coating is of aluminum.

11. A method according to claim 7, wherein said first conductive material coating is formed from a titanium-tungsten alloy.

12. A method for interconnecting the active zones and for interconnecting gates and active zones formed in a substrate of a C/MOS integrated circuit comprising the following successive stages, after forming the constituent elements of said integrated circuit with the exception of the first connection level:

- depositing directly onto the complete circuit a coating of a first conductive material,
- laterally insulating said integrated circuit gates,
- depositing a first conductive material coating on the complete integrated circuit,
- depositing on said first conductive material coating a coating of a second material, said second material differing from said first conductive material,
- depositing on said coating of said second material a first resin coating used for eliminating the relief of said second material coating,
- etching said first resin coating so as to only leave behind resin at the locations of said active zones to be interconnected,
- forming in a second resin coating a mask representing the image of said first connection level to be formed,
- eliminating that part of said second material coating which is free from first and second resins,
- eliminating that part of said coating of the first conductive material not covered by the remainder of said coating of said second material, and
- eliminating the resins.

13. A method according to claim 12, wherein said coating of said first conductive material is etched by means of a plasma.

14. A method according to claim 12, wherein said second material coating is of silicon or silicon oxide.

15. A method according to claim 12, wherein said second material coating is of aluminum.

16. A method according to claim 12, wherein said first conductive material coating is formed from a titanium—tungsten alloy.

* * * * *